US011114285B2

(12) United States Patent
Cox et al.

(10) Patent No.: US 11,114,285 B2
(45) Date of Patent: Sep. 7, 2021

(54) APPARATUS FOR EXHAUST COOLING

(71) Applicant: Applied Materials, Inc., Santa Clara, CA (US)

(72) Inventors: Michael S. Cox, Gilroy, CA (US); Brian T. West, San Jose, CA (US); Roger M. Johnson, Livermore, CA (US); Yan Rozenzon, San Carlos, CA (US); Dinkesh Somanna, Sunnyvale, CA (US); Dustin W. Ho, Shanghai (CN)

(73) Assignee: APPLIED MATERIALS, INC., Santa Clara, CA (US)

( * ) Notice: Subject to any disclaimer, the term of this patent is extended or adjusted under 35 U.S.C. 154(b) by 92 days.

(21) Appl. No.: 15/487,324

(22) Filed: Apr. 13, 2017

(65) Prior Publication Data

US 2017/0301524 A1 Oct. 19, 2017

(30) Foreign Application Priority Data

Apr. 13, 2016 (WO) ................ PCT/CN2016/079153

(51) Int. Cl.
*H01J 37/32* (2006.01)
*H01L 21/67* (2006.01)

(52) U.S. Cl.
CPC .. *H01J 37/32844* (2013.01); *H01L 21/67069* (2013.01); *H01J 2237/002* (2013.01);
(Continued)

(58) Field of Classification Search
CPC .... F28D 7/0041; F28D 1/0461; F28D 9/0006; F28D 9/0081; H01J 37/32834; H01J 37/32844
(Continued)

(56) References Cited

U.S. PATENT DOCUMENTS 2,290,323 A * 7/1942 Graham ................. B01D 45/08
55/436
2,514,894 A * 7/1950 Naab ....................... F02C 7/275
165/161
(Continued)

FOREIGN PATENT DOCUMENTS

CN 203779727 U 8/2014
CN 104973603 A 10/2015
(Continued)

OTHER PUBLICATIONS

Taiwanese Office Action (with attached English translation) for Application No. 106112166; dated Dec. 24, 2018; 9 total pages.
(Continued)

*Primary Examiner* — Len Tran
*Assistant Examiner* — Jenna M Hopkins
(74) *Attorney, Agent, or Firm* — Patterson + Sheridan LLP

(57) ABSTRACT

Embodiments disclosed herein include an abatement system for abating compounds produced in semiconductor processes. The abatement system includes an exhaust cooling apparatus located downstream of a plasma source. The exhaust cooling apparatus includes at least one cooling plate a device for introducing turbulence to the exhaust flowing within the exhaust cooling apparatus. The device may be a plurality of fins, a cylinder with a curved top portion, or a diffuser with angled blades. The turbulent flow of the exhaust within the exhaust cooling apparatus causes particles to drop out of the exhaust, minimizing particles forming in equipment downstream of the exhaust cooling apparatus.

20 Claims, 12 Drawing Sheets

(52) U.S. Cl.
CPC . *H01J 2237/18* (2013.01); *H01J 2237/31701* (2013.01); *Y02C 20/30* (2013.01)

(58) Field of Classification Search
USPC ........................ 165/159, 160, 161, 164, 157; 261/DIG. 10, 158; 156/345.29; 55/442, 55/434.3, 444, 445
See application file for complete search history.

(56) References Cited

U.S. PATENT DOCUMENTS

| | | | | |
|---|---|---|---|---|
| 3,081,068 A * | 3/1963 | Milleron | ................. | B01D 8/00 62/55.5 |
| 3,892,550 A * | 7/1975 | Riis | ..................... | B01D 5/0003 55/434.2 |
| 5,141,714 A * | 8/1992 | Obuchi | .................. | B01D 39/20 422/169 |
| 5,211,729 A * | 5/1993 | Sherman | ............... | B01D 45/08 118/326 |
| 5,422,081 A * | 6/1995 | Miyagi | .................... | B01D 8/00 422/170 |
| 5,427,610 A * | 6/1995 | Croker | ................. | B01D 5/0006 55/308 |
| 5,453,125 A | 9/1995 | Krogh | | |
| 5,456,945 A | 10/1995 | McMillan et al. | | |
| 5,545,240 A | 8/1996 | Tsuru et al. | | |
| 5,709,263 A | 1/1998 | Mira | | |
| 5,746,790 A * | 5/1998 | Niimura | ................. | B01D 45/16 55/317 |
| 5,758,418 A | 6/1998 | Chrysler et al. | | |
| 5,763,950 A | 6/1998 | Fujisaki et al. | | |
| 5,810,077 A | 9/1998 | Nakamura et al. | | |
| 5,819,683 A * | 10/1998 | Ikeda | .................... | B01D 53/34 118/724 |
| 5,820,641 A * | 10/1998 | Gu | ........................ | B01D 5/0006 55/434.4 |
| 5,904,757 A * | 5/1999 | Hayashi | ................. | B01D 45/08 96/416 |
| 5,927,386 A | 7/1999 | Lin | | |
| 5,928,426 A | 7/1999 | Aitchison | | |
| 5,933,325 A | 8/1999 | Hou | | |
| 5,937,517 A | 8/1999 | Smith et al. | | |
| 5,946,190 A | 8/1999 | Patel et al. | | |
| 6,015,463 A * | 1/2000 | Cox | .................... | C23C 16/4412 118/715 |
| 6,156,107 A * | 12/2000 | Hayashi | ................. | B01D 45/08 438/905 |
| 6,238,514 B1 * | 5/2001 | Gu | ........................ | B01D 5/0036 118/715 |
| 6,241,793 B1 * | 6/2001 | Lee | .......................... | B01D 8/00 55/434.2 |
| 6,308,771 B1 * | 10/2001 | Tavassoli | ................. | F28F 3/02 165/80.3 |
| 6,488,745 B2 * | 12/2002 | Gu | .......................... | B01D 8/00 55/434.4 |
| 6,528,420 B1 * | 3/2003 | Tong | .................... | B01D 53/507 438/680 |
| 6,966,936 B2 * | 11/2005 | Yamasaki | ................ | C23C 16/18 55/385.2 |
| 7,044,997 B2 * | 5/2006 | Mardian | .............. | B01D 5/0006 55/282.2 |
| 7,387,685 B2 * | 6/2008 | Carpenter | .......... | C23C 16/45544 118/715 |
| 7,491,291 B2 | 2/2009 | Park | | |
| 7,727,296 B2 * | 6/2010 | Tojo | ....................... | B01D 45/06 118/715 |
| 7,803,208 B2 * | 9/2010 | Kawasaki | ............ | B01D 45/06 55/434 |
| 7,867,312 B2 * | 1/2011 | Engerran | ............ | C23C 16/4486 55/318 |
| 8,057,564 B2 * | 11/2011 | Tsuji | ..................... | B01D 45/08 55/315 |
| 8,172,946 B2 * | 5/2012 | Taniyama | ........... | C23C 16/4412 118/715 |
| 8,246,705 B2 * | 8/2012 | Bain | ....................... | F24C 15/20 126/299 E |
| 8,915,775 B2 * | 12/2014 | Ikeda | .................. | C23C 16/4412 454/49 |
| 9,057,388 B2 * | 6/2015 | Comeau | .................. | C23C 16/50 |
| 9,240,308 B2 | 1/2016 | Cox et al. | | |
| 9,669,139 B2 * | 6/2017 | Coulthard | ........... | A61M 1/0049 |
| 9,896,761 B2 * | 2/2018 | Hara | ....................... | C23C 16/16 |
| 10,036,090 B2 * | 7/2018 | Komori | ............... | C23C 16/4405 |
| 10,861,681 B2 * | 12/2020 | L'Heureux | ........ | H01J 37/32889 |
| 2001/0003892 A1 * | 6/2001 | Rikyuu | .................. | B01D 45/08 55/315.2 |
| 2002/0066550 A1 | 6/2002 | Tavassoli | | |
| 2002/0159924 A1 | 10/2002 | Arno et al. | | |
| 2004/0000393 A1 | 1/2004 | Tavassoli | | |
| 2006/0162862 A1 * | 7/2006 | Park | ....................... | B01D 5/0015 156/345.29 |
| 2006/0169411 A1 * | 8/2006 | Han | ..................... | C23C 16/4412 156/345.29 |
| 2007/0175188 A1 * | 8/2007 | Tsuji | ....................... | B01D 45/08 55/444 |
| 2008/0072585 A1 * | 3/2008 | Ikeda | ................... | C23C 16/4412 60/324 |
| 2008/0104935 A1 * | 5/2008 | Tojo | ......................... | B01D 45/06 55/282 |
| 2009/0217634 A1 * | 9/2009 | Choi | ....................... | B01D 45/08 55/426 |
| 2012/0258516 A1 * | 10/2012 | Schultz | ................. | B01F 3/0807 435/194 |
| 2013/0284724 A1 * | 10/2013 | Cox | ..................... | H01J 37/32844 219/635 |
| 2013/0340681 A1 * | 12/2013 | Wagner | ............. | C23C 16/4412 118/723 R |
| 2014/0262033 A1 * | 9/2014 | Herbert | ............. | H01J 37/32834 156/345.29 |
| 2015/0000870 A1 * | 1/2015 | Hosotani | ................... | F02C 7/08 165/104.19 |
| 2015/0187562 A1 | 7/2015 | Lee et al. | | |
| 2015/0247658 A1 * | 9/2015 | Cosby, II | ................ | F25B 39/04 62/119 |
| 2015/0252473 A1 | 9/2015 | Dickinson | | |
| 2015/0255256 A1 * | 9/2015 | Cox | .................. | H01J 37/32669 156/345.29 |
| 2015/0357168 A1 | 12/2015 | Dickinson | | |
| 2016/0018168 A1 * | 1/2016 | Urbanski | ................... | F28D 7/16 165/159 |
| 2016/0107117 A1 * | 4/2016 | Raj | ....................... | H01J 37/321 422/168 |
| 2016/0133442 A1 | 5/2016 | Cox et al. | | |
| 2018/0166306 A1 * | 6/2018 | Hou | ..................... | H01L 21/67173 |
| 2018/0337027 A1 * | 11/2018 | L'Heureux | ........ | H01L 21/67109 |

FOREIGN PATENT DOCUMENTS

| | | |
|---|---|---|
| JP | 2004-063866 A | 2/2004 |
| JP | 2005052786 A | 3/2005 |
| TW | 201536114 A | 9/2015 |
| TW | 201604320 A | 2/2016 |
| WO | 2014144162 A1 | 9/2014 |

OTHER PUBLICATIONS

PCT Notification of Transmittal of the International Search Report and the Written Opinion of the International Searching Authority for International Application No. PCT/US2018/029031; dated Jul. 31, 2018; 10 total pages.

Japan Office Action dated Feb. 25, 2020 for Application No. 2018-554109.

Japanese Office Action dated Feb. 15, 2021 for Application No. 2018-554109.

* cited by examiner

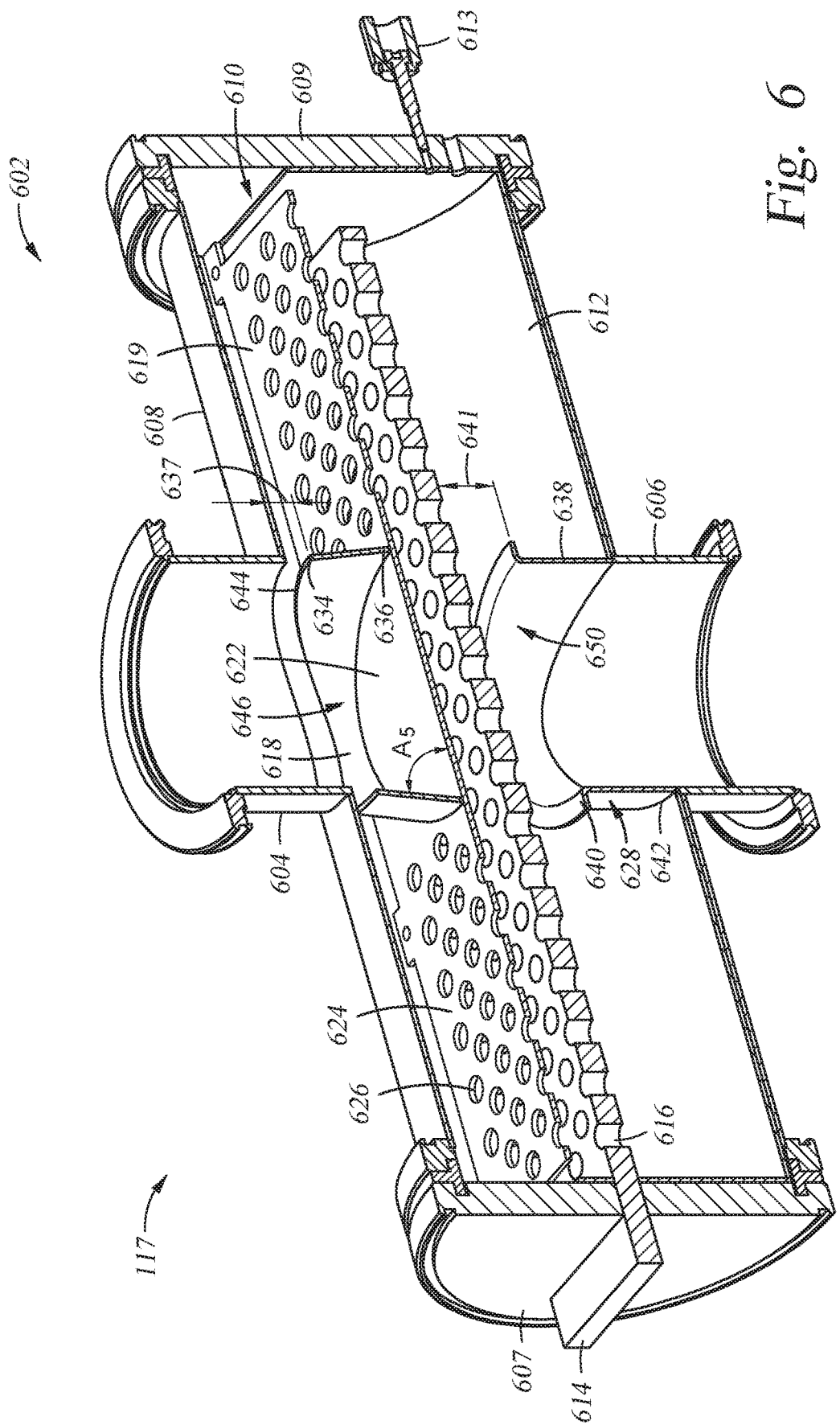

APPARATUS FOR EXHAUST COOLING

BACKGROUND

Field

Embodiments of the present disclosure generally relate to semiconductor processing equipment. More particularly, embodiments of the present disclosure relate to an abatement system and a vacuum processing system for abating compounds produced in semiconductor processes.

Description of the Related Art

The process gases used by semiconductor processing facilities include many compounds, such as perfluorocarbons (PFCs), which must be abated or treated before disposal, due to regulatory requirements and environmental and safety concerns. Typically, a remote plasma source may be coupled to a processing chamber to abate the compounds coming out of the processing chamber. A reagent may be injected into the plasma source to assist the abatement of the compounds.

Conventional abatement technology for abating PFCs utilizes water vapor as a reagent, which provides good destruction removal efficiency (DRE). However, abatement of certain compounds using water vapor in the remote plasma source can result in the formation of solid particles in the remote plasma source and equipment downstream of the remote plasma source, such as exhaust line and pumps. In addition, the exhaust exiting the remote plasma source may be at an elevated temperature, which can cause issues at the pump downstream of the remote plasma source.

Accordingly, what is needed in the art is an improved abatement system for abating compounds produced in semiconductor processes.

SUMMARY

Embodiments of the present disclosure relate to an abatement system and a vacuum processing system for abating compounds produced in processes. In one embodiment, an exhaust cooling apparatus includes a body having an inlet and an outlet and a plurality of cooling plates disposed within the body. The plurality of cooling plates form a serpentine passage.

In another embodiment, an exhaust cooling apparatus includes a body having an inlet and an outlet and a plurality of hollow cylinders disposed within the body. The plurality of hollow cylinders are concentric.

In another embodiment, an exhaust cooling apparatus includes a body having an inlet and an outlet, a cooling plate disposed within the body, and a device disposed over the cooling plate. The device includes a wall and a plate coupled to the wall.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 6 is a cross-sectional view of the exhaust cooling apparatus according to one embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
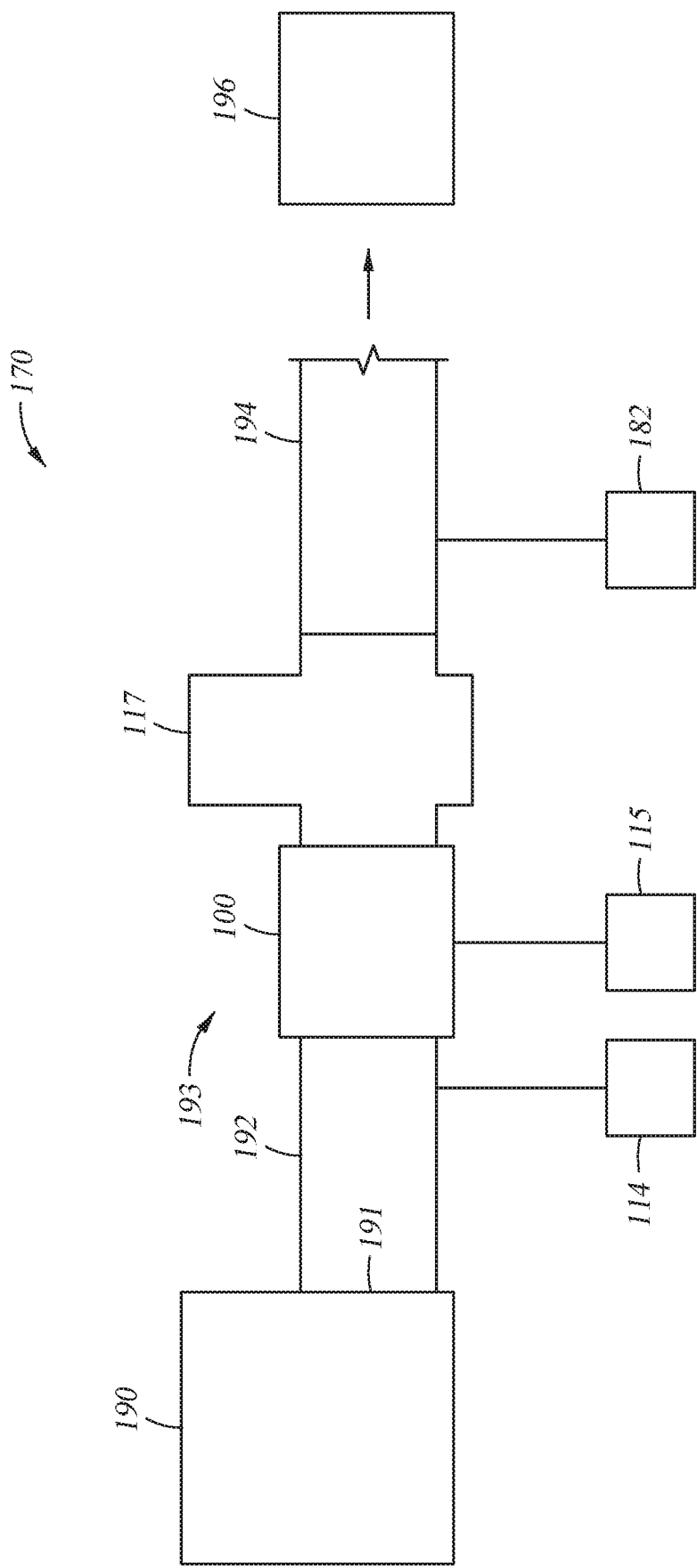
FIG. 1 is a schematic side view of a vacuum processing system including an exhaust cooling apparatus according to one embodiment described herein.

FIG. 1 is a schematic side view of a vacuum processing system 170 having an exhaust cooling apparatus 117 utilized in an abatement system 193. The vacuum processing system 170 includes at least a vacuum processing chamber 190, a plasma source 100, and the exhaust cooling apparatus 117. The abatement system 193 includes at least the plasma source 100 and the exhaust cooling apparatus. The vacuum processing chamber 190 is generally configured to perform at least one integrated circuit manufacturing process, such as a deposition process, an etch process, a plasma treatment process, a preclean process, an ion implant process, or other integrated circuit manufacturing process. The process performed in the vacuum processing chamber 190 may be plasma assisted. For example, the process performed in the vacuum processing chamber 190 may be a plasma deposition process for depositing a silicon-based material or a plasma etch process for removing a silicon-based material.

The vacuum processing chamber 190 has a chamber exhaust port 191 coupled to the plasma source 100 of the abatement system 193 via a foreline 192. The exhaust cooling apparatus 117 is coupled to an exhaust of the plasma source 100 in order to cool the exhaust coming out of the plasma source and to collect particles formed in the plasma source. The exhaust cooling apparatus 117 is coupled to an exhaust conduit 194 to pumps and facility exhaust, schematically indicated by a single reference numeral 196 in FIG. 1. The pumps are generally utilized to evacuate the vacuum processing chamber 190, while the facility exhaust generally includes scrubbers or other exhaust cleaning apparatus for preparing the effluent of the vacuum processing chamber 190 to enter the atmosphere.

The plasma source 100 is utilized to perform an abatement process on gases and/or other materials exiting the vacuum processing chamber 190 so that such gases and/or other materials may be converted into a more environmentally and/or process equipment friendly composition. In some embodiments, an abatement reagent source 114 is couple to the foreline 192 and/or the plasma source 100. The abatement reagent source 114 provides an abatement reagent into the plasma source 100 which may be energized to react with or otherwise assist converting the materials to be exiting the vacuum processing chamber 190 into a more environmentally and/or process equipment friendly composition. Optionally, a purge gas source 115 may be coupled to the plasma source 100 for reducing deposition on components inside the plasma source 100.

The exhaust cooling apparatus 117 is coupled between the plasma source 100 and the exhaust conduit 194 for reducing the temperature of the exhaust coming out of the plasma source 100 and for collecting particles formed in the plasma source 100. In one example, the exhaust cooling apparatus 117 is a part of the abatement system 193.

Optionally, a pressure regulating module 182 may be coupled to at least one of the plasma source 100 or the exhaust conduit 194. The pressure regulating module 182 injects a pressure regulating gas, such as Ar, N, or other suitable gas which allows the pressure within the plasma source 100 to be better controlled, and thereby provide more efficient abatement performance. In one example, the pressure regulating module 182 is a part of the abatement system 193.

Figure 2A:
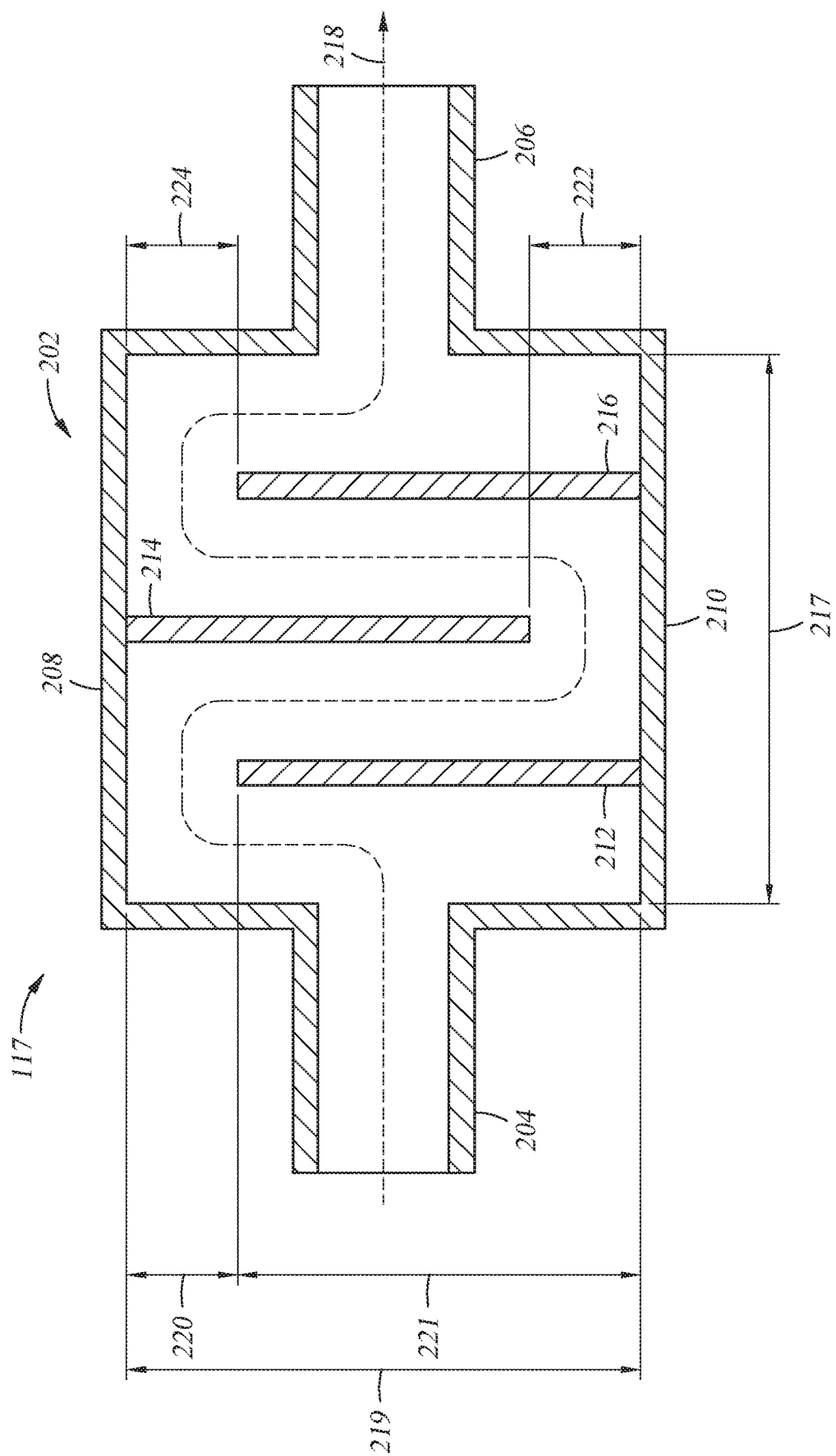
FIG. 2A is a schematic cross-sectional view of the exhaust cooling apparatus according to one embodiment described herein.

FIG. 2A is a schematic cross-sectional view of the exhaust cooling apparatus 117 according to one embodiment described herein. As shown in FIG. 2A, the exhaust cooling apparatus 117 includes a body 202 having an inlet 204, an outlet 206, a first wall 208, and a second wall 210 opposite the first wall 208. A plurality of cooling plates 212, 214, 216 may be coupled to the first wall 208 and/or second wall 210 along a width 217 of the exhaust cooling apparatus 117. The width 217 of the exhaust cooling apparatus 117 is defined between the inlet 204 and the outlet 206. The exhaust cooling apparatus 117 may have a length 219 defined between the first wall 208 and the second wall 210. Each cooling plate 212, 214, 216 may have a length 221 that is less than the length 219 of the exhaust cooling apparatus 117. The length 221 of each cooling plate 212, 214, 216 may be the same or may be different. Each cooling plate 212, 214, 216 may have a width (into the paper) that is the same as the thickness (into the paper) of the exhaust cooling apparatus 117.

The exhaust exiting the plasma source 100 enters the exhaust cooling apparatus 117 via the inlet 204 and exits the exhaust cooling apparatus 117 via the outlet 206. The exhaust may flow along a serpentine passage 218 formed by the plurality of cooling plates 212, 214, 216. The plurality of cooling plates 212, 214, 216 may be alternately coupled to opposite walls 208, 210 and gaps 220, 222, 224 may be formed between cooling plates 212, 214, 216 and a wall opposite the wall the cooling plates 212, 214, 216 are coupled thereto, respectively. For example, as shown in FIG. 2A, the cooling plate 212 is coupled to the second wall 210, and the gap 220 is formed between the cooling plate 212 and the first wall 208. An adjacent cooling plate (i.e., cooling plate 214) to the cooling plate 212 is coupled to the first wall 208, and the gap 222 is formed between the cooling plate 214 and the second wall 210. An adjacent cooling plate (i.e., cooling plate 216) to the cooling plate 214 is coupled to the second wall 210, and the gap 224 is formed between the cooling plate 216 and the first wall 208. The gaps 220, 222, 224 may be large enough to ensure no pressure buildup inside the exhaust cooling apparatus 117. In some embodiments, since the width of each cooling plate 212, 214, 216 is the same as the thickness of the exhaust cooling apparatus 117, exhaust flowing through the exhaust cooling apparatus 117 passes the plurality of cooling plates 212, 214, 216 via gaps 220, 222, 224, respectively. In other embodiments, the width of each cooling plate 212, 214, 216 may be smaller than the thickness of the exhaust cooling apparatus 117, exhaust flowing through the exhaust cooling apparatus 117 passes the plurality of cooling plates 212, 214, 216 not only via gaps 220, 222, 224, respectively, but also via gaps formed between cooling plates 212, 214, 216 and walls defining the thickness of the exhaust cooling apparatus 117.

The cooling plates 212, 214, 216 may be made of stainless steel, aluminum, nickel coated aluminum, or any suitable material. A channel (not shown) may be formed in each cooling plate 212, 214, 216 for flowing a coolant therethrough. Having the coolant flowing through each cooling plate 212, 214, 216 causes the temperature of each cooling plate 212, 214, 216 to be less than the temperature of the exhaust entering the exhaust cooling apparatus 117. The exhaust entering the exhaust cooling apparatus 117 is cooled by the cooling plates 212, 214, 216, and cooled surfaces of the cooling plates 212, 214, 216 also condense solid particles in the exhaust, preventing solid by-product materials from exiting the exhaust cooling apparatus 117 and reaching pumps and facility exhaust 196. In one embodiment, the cooling plates 212, 214, 216 do not include the channel for a coolant to flow therethrough, and the temperature of the surfaces of the cooling plates 212, 214, 216 is low enough to cool the exhaust and to condense solid particles in the exhaust. The number of cooling plates 212, 214, 216 located within the exhaust cooling apparatus may range from two to 10.

Figure 2B:
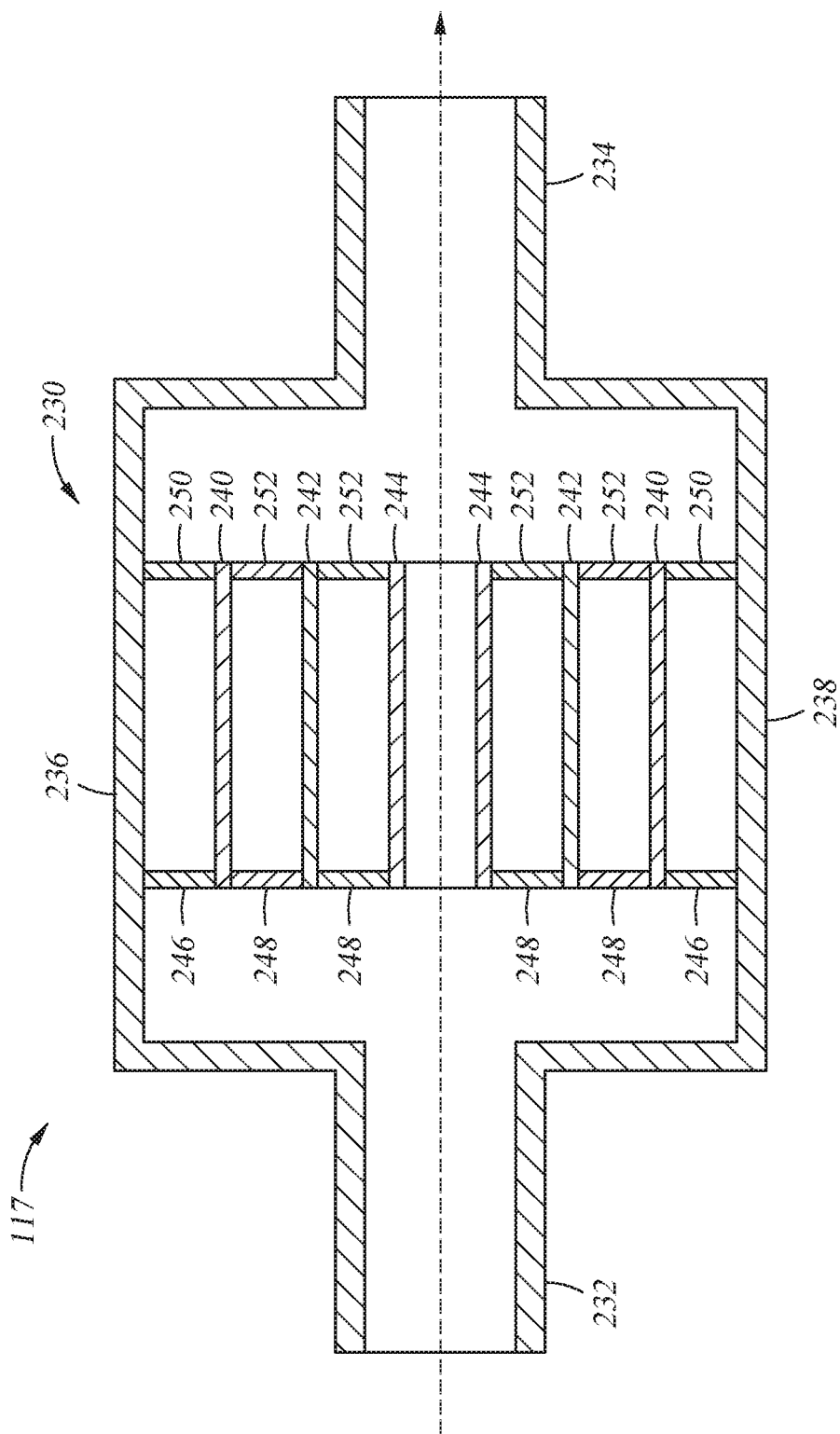
FIG. 2B is a schematic cross-sectional view of the exhaust cooling apparatus according to another embodiment described herein.

FIG. 2B is a schematic cross-sectional view of the exhaust cooling apparatus 117 according to another embodiment described herein. As shown in FIG. 2B, the exhaust cooling apparatus 117 includes a body 230 having an inlet 232, an outlet 234, a first wall 236, and a second wall 238 opposite the first wall 236. A plurality of cylinders 240, 242, 244 may be located within the body 230 of the exhaust cooling apparatus 117. The cylinders 240, 242, 244 may be hollow and concentric, such that the cylinder 244 is disposed within the cylinder 242, and the cylinder 242 is disposed within the cylinder 240. The body 230 of the exhaust cooling apparatus 117 may be a hyper-rectangle, as shown in FIG. 2B, or the body 230 may be a hollow cylinder that is concentric with the plurality of cylinders 240, 242, 244.

Figure 2C:
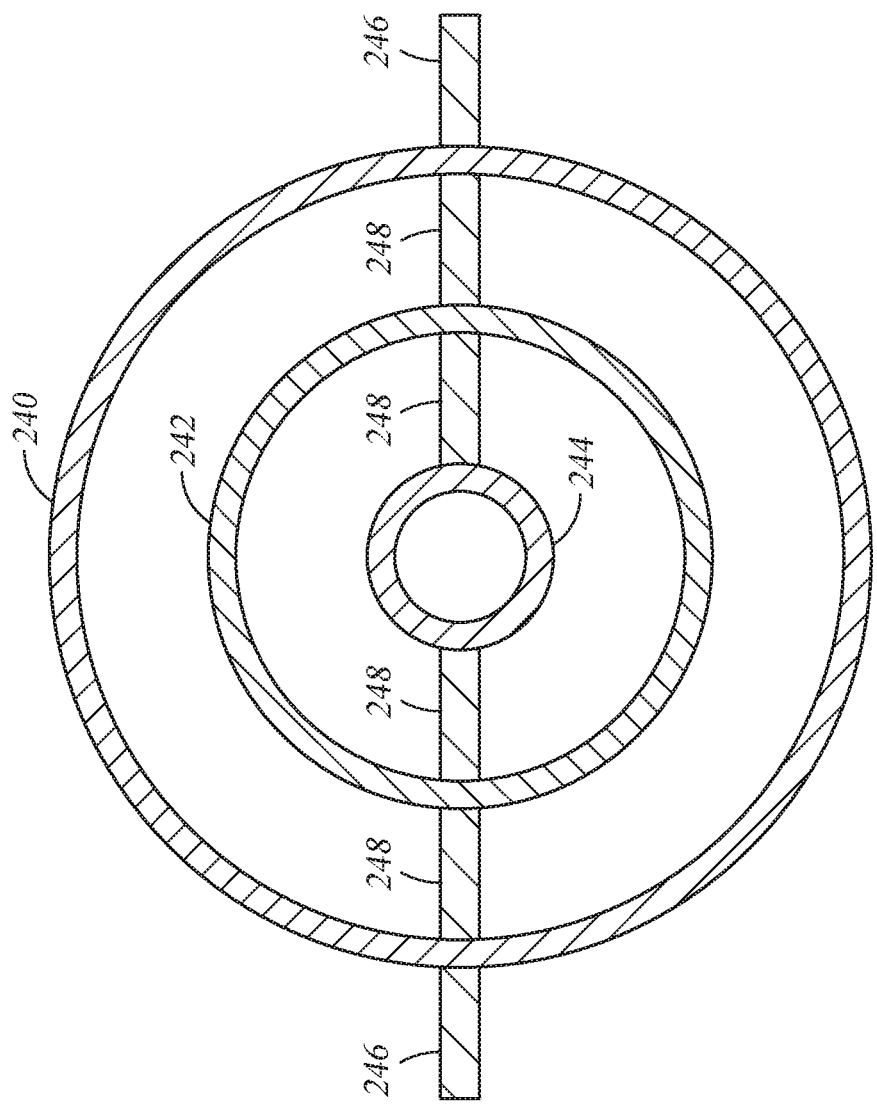
FIG. 2C is a schematic cross-sectional top view of cylinders and coupling members according to one embodiment described herein.

Each of the plurality of cylinders 240, 242, 244 may be made of stainless steel, aluminum, nickel coated aluminum, or any suitable material. Coupling members 246 may be utilized to couple the cylinder 240 to the walls 236, 238, and coupling members 248 may be utilized to couple the cylinders 240, 242, 244 to each other. Additional coupling members 250 may be utilized to couple the cylinder 240 to the walls 236, 238, and coupling members 252 may be utilized to couple the cylinders 240, 242, 244 to each other. FIG. 2C is a cross-sectional top view of the cylinders 240, 242, 244 and coupling members 246, 248. Coupling members 246, 248, 250, 252 may be made of the same material as the cylinders 240, 242, 244. In some embodiments, a channel (not shown) may be formed in the coupling members 246, 248, 250, 252 and the cylinders 240, 242, 244 for flowing a coolant therethrough.

Referring back to FIG. 2B, having the coolant flowing through each cylinder 240, 242, 244 causes the temperature of each cylinder 240, 242, 244 to be less than the temperature of the exhaust entering the exhaust cooling apparatus 117. The exhaust entering the exhaust cooling apparatus 117 flows through gaps formed between the cylinders 240, 242, 244 and between the cylinder 240 and the walls 236, 238. The exhaust is cooled by the cylinders 240, 242, 244, and cooled surfaces of the cylinders 240, 242, 244 also condense solid particles in the exhaust, preventing solid by-product materials from exiting the exhaust cooling apparatus 117 and reaching pumps and facility exhaust 196. In one embodiment, the cylinders 240, 242, 244 do not include the channel for a coolant to flow therethrough, and the temperature of the surfaces of the cylinders 240, 242, 244 is low enough to cool the exhaust and to condense solid particles in the exhaust. The number of cylinders 240, 242, 244 located within the exhaust cooling apparatus may range from two to five.

Figure 3:
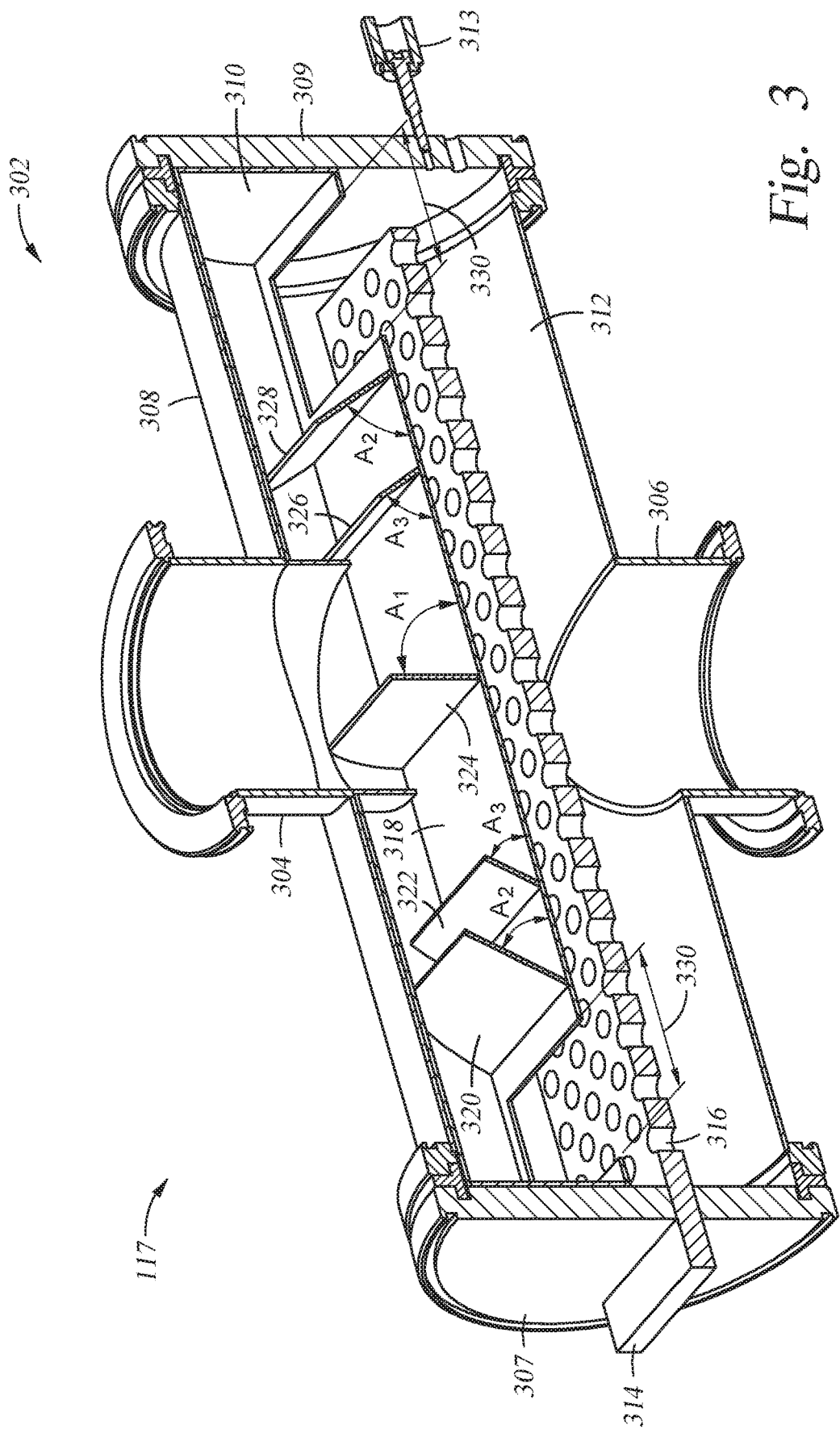
FIG. 3 is a cross-sectional view of the exhaust cooling apparatus according to one embodiment described herein.

FIG. 3 is a cross-sectional view of the exhaust cooling apparatus 117 according to one embodiment described herein. As shown in FIG. 3, the exhaust cooling apparatus 117 includes a body 302 having an inlet 304, an outlet 306, a first end 307, a second end 309 opposite the first end 307, and a wall 308 between the inlet 304 and the outlet 306 and between the first end 307 and the second end 309. The second end 309 may be removably coupled to the wall 308. The wall 308 may be cylindrical, as shown in FIG. 3. The exhaust cooling apparatus 117 may include a first liner 310 adjacent to the inlet 304, a second liner 312 adjacent to the outlet 306, and a cooling plate 314 disposed between the first liner 310 and the second liner 312. The first liner 310, the second liner 312, and the cooling plate 314 may be made of stainless steel, aluminum, nickel coated aluminum, or any suitable material. The cooling plate 314 may be coupled to the first end 307. The first liner 310 may be coupled to the second end 309 and the second liner 312 may be coupled to the second end 309. The cooling plate 314 may include a plurality of through holes 316. The diameters of each through hole 316 may be sufficiently large so there is minimum to no pressure build-up. In one embodiment, the through holes 316 each have a diameter of about 0.5 inches and the pressure restriction is less than about 100 mTorr. A channel (not shown) may be formed in the cooling plate 314 for flowing a coolant therethrough. Having the coolant flowing through the cooling plate 314 causes the temperature of the cooling plate 314 to be less than the temperature of the exhaust entering the exhaust cooling apparatus 117. The exhaust entering the exhaust cooling apparatus 117 is cooled by the cooling plate 314 as the exhaust passes through the through holes 316. In one embodiment, the cooling plate 314 does not include the channel for a coolant to flow therethrough, and the temperature of the surfaces of the cooling plate 314 is low enough to cool the exhaust.

In order to trap particles in the exhaust cooling apparatus 117, a device is utilized to introduce turbulence to the exhaust flowing within the exhaust cooling apparatus 117 adjacent a cooled structure with high conductance to prevent a pressure increase in exhaust cooling apparatus 117. The cooled structure with high conductance may be the cooling plate 314, and the device may be a plate 318 and a plurality of fins 320, 322, 324, 326, 328 extending from the plate 318. The plurality of fins 320, 322, 324, 326, 328 may be coupled to the plate 318 or may be formed integrally with the plate 318. The plate 318 and the plurality of fins 320, 322, 324, 326, 328 may be part of the first liner 310. The plate 318 may be substantially parallel to the cooling plate 314. The plate 318 may also include one or more openings 330 for allowing the exhaust to pass through. The plurality of fins 320, 322, 324, 326, 328 extending from the plate 318 are utilized to create turbulence in the exhaust as the exhaust enters the exhaust cooling apparatus via the inlet 304. The number of fins may be any suitable number sufficient to cause turbulence in the exhaust within the exhaust cooling apparatus. In one embodiment, five fins are utilized, as shown in FIG. 3.

Each fin 320, 322, 324, 326, 328 may form an acute or right angle with respect to the plate 318. In one embodiment, the fin 324 is a center fin such that fins located on either sides of the fin 324 are mirror images of each other. For example, the fin 324 may form an angle $A_1$ with respect to the plate 318, the fins 320, 328 are mirror images of each other and may form an angle $A_2$ with respect to the plate 318, and the fins 322, 326 are mirror images of each other and may form an angle $A_3$ with respect to the plate 318. In one embodiment, the angle $A_1$ is about 90 degrees and the angle $A_2$ is greater than the angle $A_3$. The angle the fins form with respect to the plate 318 may be any suitable angle in order to cause turbulence in the exhaust in the exhaust cooling apparatus.

During operation, exhaust exiting the plasma source 100 (FIG. 1) enters the exhaust cooling apparatus 117 via the inlet 304. The flow of the exhaust becomes turbulent as the exhaust flows passing the fins 320, 322, 324, 326, 328 and the plate 318, causing particles to drop out of the exhaust. Some particles may be collected on the plate 318, and some particles may be collected on the second liner 312, as the exhaust passes through the openings 330 in the plate 318 and through holes 316 in the cooling plate 314. The second end 309, along with the first liner 310 and the second liner 312, may be pulled out of the exhaust cooling apparatus in order to remove the particles collected on the plate 318 and on the second liner 312. The pressure inside the exhaust cooling apparatus 117 during operation is monitored by a pressure sensor 313. The pressure sensor 313 may be coupled to the second end 309, as shown in FIG. 3.

Figure 4:
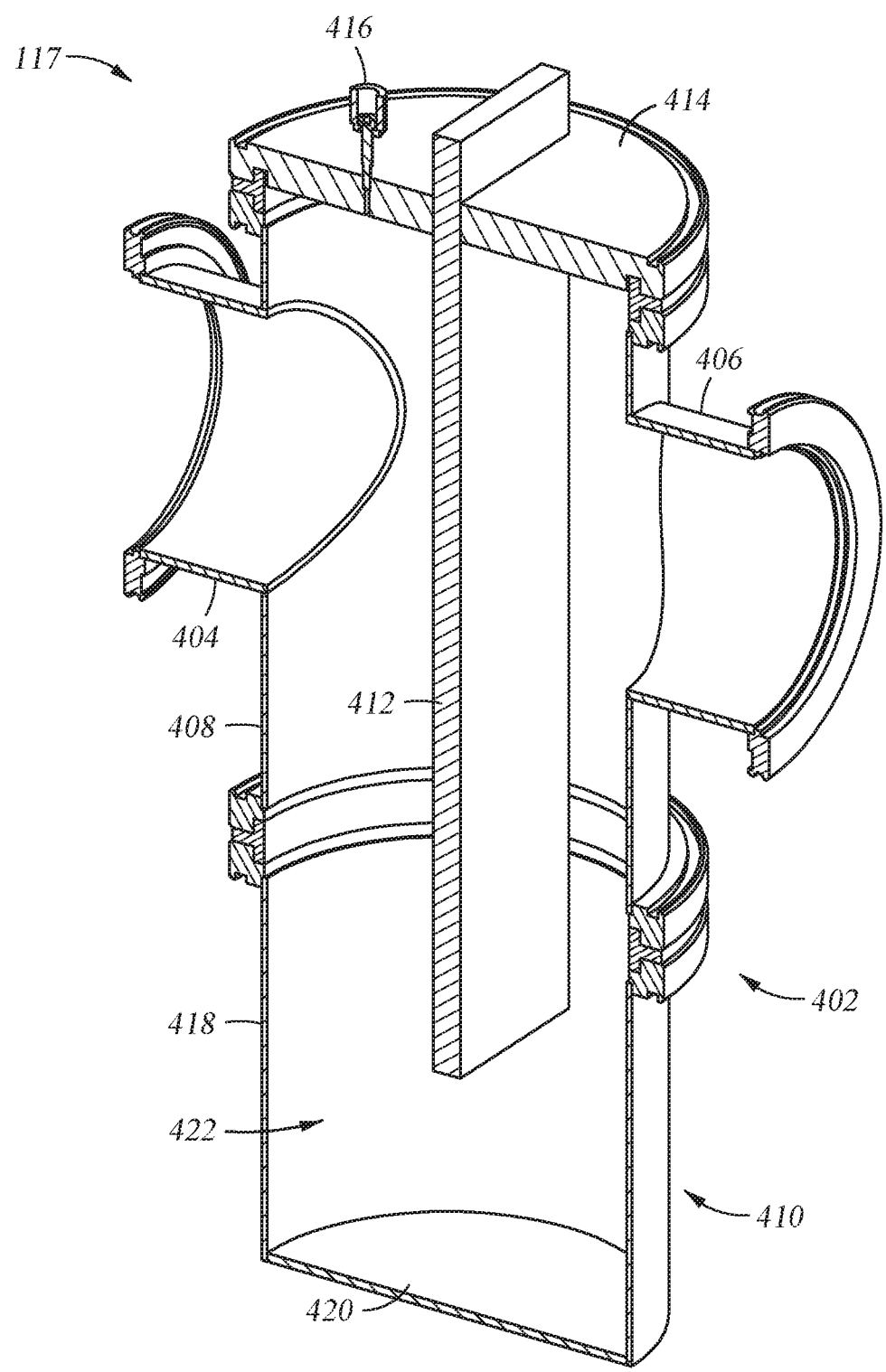
FIG. 4 is a cross-sectional view of the exhaust cooling apparatus according to one embodiment described herein.

FIG. 4 is a cross-sectional view of the exhaust cooling apparatus 117 according to one embodiment described herein. As shown in FIG. 4, the exhaust cooling apparatus 117 includes a body 402 having an inlet 404, an outlet 406, a wall 408 between the inlet 404 and the outlet 406, and a collection device 410 coupled to the wall 408. The wall 408 may be cylindrical, as shown in FIG. 4. The exhaust cooling apparatus 117 may include an end 414 between the inlet 404 and the outlet 406 and a cooling plate 412 coupled to the end 414. The cooling plate 412 may be made of stainless steel, aluminum, nickel coated aluminum, or any suitable material. A channel (not shown) may be formed in the cooling plate 412 for flowing a coolant therethrough. Having the coolant flowing through the cooling plate 412 causes the temperature of the cooling plate 412 to be less than the temperature of the exhaust entering the exhaust cooling apparatus 117. The exhaust entering the exhaust cooling apparatus 117 is cooled by the cooling plate 412, and cooled surfaces of the cooling plate 412 also condense solid particles in the exhaust, preventing solid by-product materials from exiting the exhaust cooling apparatus 117 and reaching pumps and facility exhaust 196. In one embodiment, the cooling plate 412 does not include the channel for a coolant to flow therethrough, and the temperature of the surfaces of the cooling plate 412 is low enough to cool the exhaust and to condense solid particles in the exhaust.

The particles accumulated on the cooling plate 412 may fall into the collection device 410 by gravity. The collection device 410 includes a wall 418 and a bottom 420. The bottom 420 is disposed below the cooling plate 412 such that the particles accumulated on the cooling plate 412 fall onto the bottom 420 of the collection device 410 by gravity. In other words, the bottom 420 may be located downstream of the cooling plate 412 with respect to gravity. The wall 418 may be cylindrical, as shown in FIG. 4, and a portion of the cooling plate 412 may extend into an opening 422 defined by the wall 418. The collection device 410 may be removably coupled to the wall 408 in order to conveniently remove particles in the collection device 410. The pressure inside the exhaust cooling apparatus 117 during operation is monitored by a pressure sensor 416. The pressure sensor 416 may be coupled to the end 414, as shown in FIG. 4.

Figure 5:
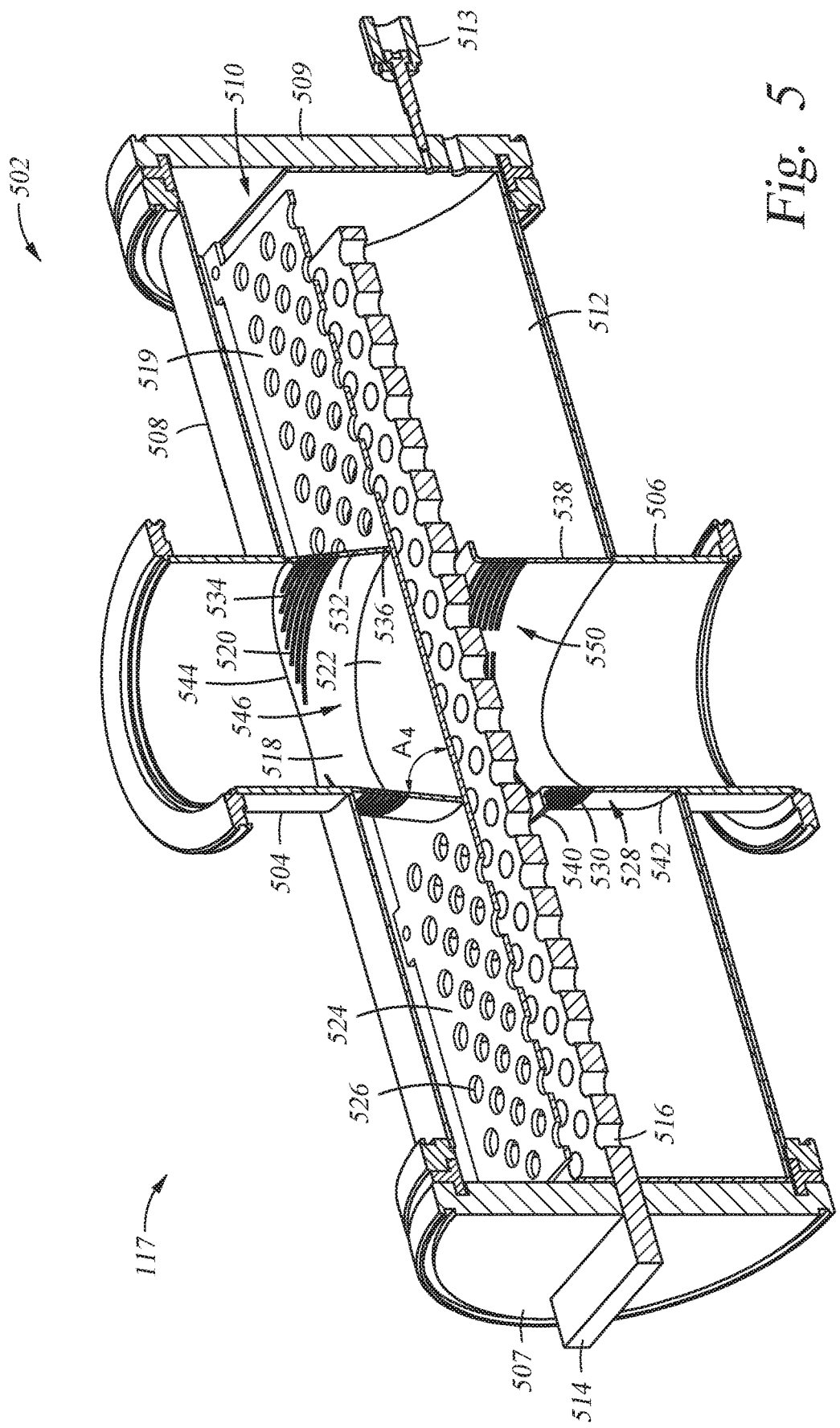
FIG. 5 is a cross-sectional view of the exhaust cooling apparatus according to one embodiment described herein.

FIG. 5 is a cross-sectional view of the exhaust cooling apparatus 117 according to one embodiment described herein. As shown in FIG. 5, the exhaust cooling apparatus 117 includes a body 502 having an inlet 504, an outlet 506, a first end 507, a second end 509 opposite the first end 507, and a wall 508 between the inlet 504 and the outlet 506 and between the first end 507 and the second end 509. The second end 509 may be removably coupled to the wall 508. The wall 508 may be cylindrical, as shown in FIG. 5. The exhaust cooling apparatus 117 may include a first liner 510 adjacent to the inlet 504, a second liner 512 adjacent to the outlet 506, and a cooling plate 514 disposed between the first liner 510 and the second liner 512. The first liner 510, the second liner 512, and the cooling plate 514 may be made of stainless steel, aluminum, nickel coated aluminum, or any suitable material. The cooling plate 514 may be coupled to the first end 507. The first liner 510 may be coupled to the second end 509 and the second liner 512 may be coupled to the second end 509. The cooling plate 514 may include a plurality of through holes 516. The cooling plate 514 may be the same as the cooling plate 314 shown in FIG. 3.

In order to trap particles in the exhaust cooling apparatus 117, a device is utilized to introduce turbulence to the exhaust flowing within the exhaust cooling apparatus 117 adjacent a cooled structure with high conductance to prevent a pressure increase in exhaust cooling apparatus 117. The cooled structure with high conductance may be the cooling plate 514, and the device may be a device 518 disposed on a plate 519. The plate 519 and the device 518 may be part of the first liner 510. The plate 519 may be substantially parallel to the cooling plate 514. The plate 519 may include a first portion 522 defined by the device 518 and a second portion 524 having a plurality of through holes 526. Each through hole 526 is aligned with a corresponding through hole 516 of the cooling plate 514.

The device 518 may include a wall 532, a first end 534, and a second end 536. The first end 534 device 518 may be adjacent or coupled to the inlet 504, and the second end 536 may be coupled to the plate 519 to define the first portion 522. The first portion 522 does not include any through holes. In one embodiment, the wall 532 is cylindrical, i.e., the wall 532 form an angle $A_4$ with respect to the first portion 522 of the plate 519, and the angle $A_4$ is about 90 degrees. In another embodiment, the angle $A_4$ is an acute angle, as shown in FIG. 5. In another embodiment, the angle $A_4$ is an obtuse angle. The first end 534 of the device 518 may include a top portion 544 having a curved side profile, as shown in FIG. 5. The curved side profile of the top portion 544 may include both concave and convex side profiles. The device 518 may further include a plurality of slit openings 520 in the wall 532 at the first end 534. The slit openings 520 may be located on the wall 532 from the first end 534 up to the center of the wall 532, and the center of the wall 532 is defined as the center point between the first end 534 and the second end 536.

The second liner 512 may include a device 528 having a wall 538, a first end 540, and a second end 542. The wall 538 may be cylindrical, as shown in FIG. 5. The first end 540 may be adjacent to the cooling plate 514, and the second end 542 may be adjacent or coupled to the outlet 506. A plurality of slit openings 530 may be formed in the wall 538. The slit openings 530 may be located on the wall 538 from the first end 540 up to the center of the wall 538, and the center of the wall 538 is defined as the center point between the first end 540 and the second end 542.

During operation, exhaust exiting the plasma source 100 (FIG. 1) enters the exhaust cooling apparatus 117 via the inlet 504. The exhaust enters a region 546 surrounded by the device 518. The flow of the exhaust becomes turbulent as the exhaust comes into contact with the second portion 522 of the plate 519, causing particles to drop out of the exhaust. The exhaust exits the region 546 via the plurality of slit openings 520, and the slit openings 520 can block particles remained in the exhaust from exiting the region 546. Particles dropped out of the exhaust and blocked by the slit openings 520 may fall onto the second portion 522 of the plate 519. The exhaust then flows through the through holes 526 in the plate 519 and the through holes 516 in the cooling plate 514, and particles may condense and fall onto the second liner 512 as the temperature of the exhaust is reduced by the cooling plate 514. The exhaust then enters a region 550 defined by the device 528 through the plurality of slit openings 530, and the slit openings 530 can further reduce particles remained in the exhaust. The second end 509, along with the first liner 510 and the second liner 512, may be pulled out of the exhaust cooling apparatus 117 in order to remove the particles collected on first and second liners 510, 512. The pressure inside the exhaust cooling apparatus 117 during operation is monitored by a pressure sensor 513. The pressure sensor 513 may be coupled to the second end 509, as shown in FIG. 5. An injection port (not shown) may be formed in the second end 509 for injecting a reagent or diluent into the exhaust cooling apparatus 117.

FIG. 6 is a cross-sectional view of the exhaust cooling apparatus 117 according to one embodiment described herein. As shown in FIG. 6, the exhaust cooling apparatus 117 includes a body 602 having an inlet 604, an outlet 606, a first end 607, a second end 609 opposite the first end 607, and a wall 608 between the inlet 604 and the outlet 606 and between the first end 607 and the second end 609. The second end 609 may be removably coupled to the wall 608. The wall 608 may be cylindrical, as shown in FIG. 6. The exhaust cooling apparatus 117 may include a first liner 610 adjacent to the inlet 604, a second liner 612 adjacent to the outlet 606, and a cooling plate 614 disposed between the first liner 610 and the second liner 612. The first liner 610, the second liner 612, and the cooling plate 614 may be made of stainless steel, aluminum, nickel coated aluminum, or any suitable material. The cooling plate 614 may be coupled to the first end 607. The first liner 610 may be coupled to the second end 609 and the second liner 612 may be coupled to the second end 609. The cooling plate 614 may include a plurality of through holes 616. The cooling plate 614 may be the same as the cooling plate 314 shown in FIG. 3.

Figure 7A:
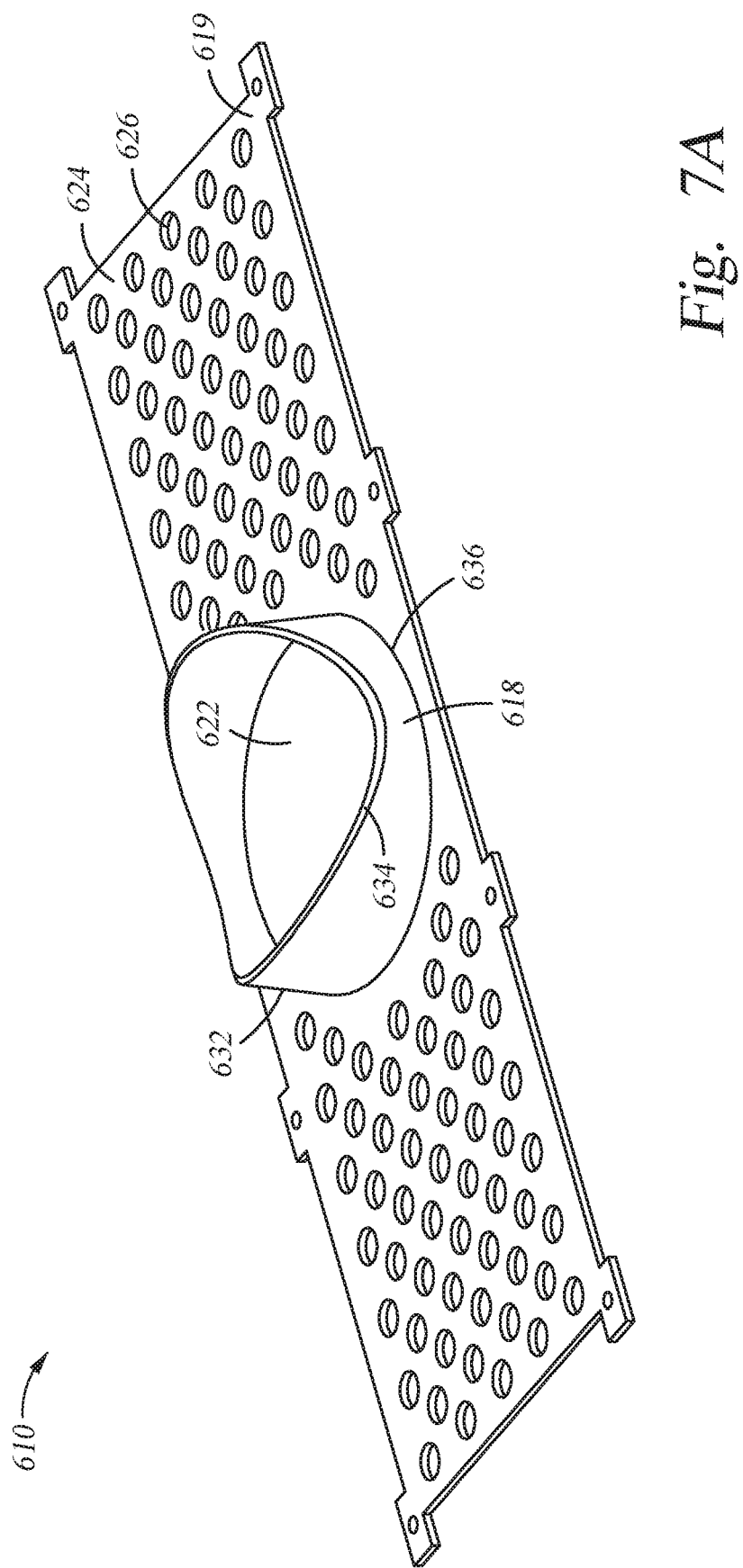
FIG. 7A is a perspective view of a portion of a liner according to one embodiment described herein.

In order to trap particles in the exhaust cooling apparatus 117, a device is utilized to introduce turbulence to the exhaust flowing within the exhaust cooling apparatus 117 adjacent a cooled structure with high conductance to prevent a pressure increase in exhaust cooling apparatus 117. The cooled structure with high conductance may be the cooling plate 614, and the device may be a device 618 disposed on a plate 619. The plate 619 and the device 618 may be part of the first liner 610. FIG. 7A is a perspective view of a portion of the first liner 610 according to one embodiment described herein. The plate 619 may be substantially parallel to the cooling plate 614. The plate 619 may include a first portion 622 defined by the device 618 and a second portion 624 having a plurality of through holes 626. Each through hole 626 may be aligned with a corresponding through hole 616 of the cooling plate 614. The device 618 may include a wall 632, a first end 634, and a second end 636.

Referring back to FIG. 6, the first end 634 of the device 618 may be spaced apart from the inlet 604 by a distance 637. The second end 536 may be coupled to the plate 619 to define the first portion 622 of the plate 619. The first portion 622 does not include any through holes. In one embodiment, the wall 632 is cylindrical, i.e., the wall 632 forms an angle $A_5$ with respect to the first portion 622 of the plate 619, and the angle $A_5$ is about 90 degrees. In another embodiment, the angle $A_5$ is an acute angle, as shown in FIG. 6. In another embodiment, the angle $A_5$ is an obtuse angle. The first end 634 of the device 618 may include a top portion 644 having a curved side profile, as shown in FIG. 6. The curved side profile of the top portion 644 may include both concave and convex side profiles.

Figure 7B:
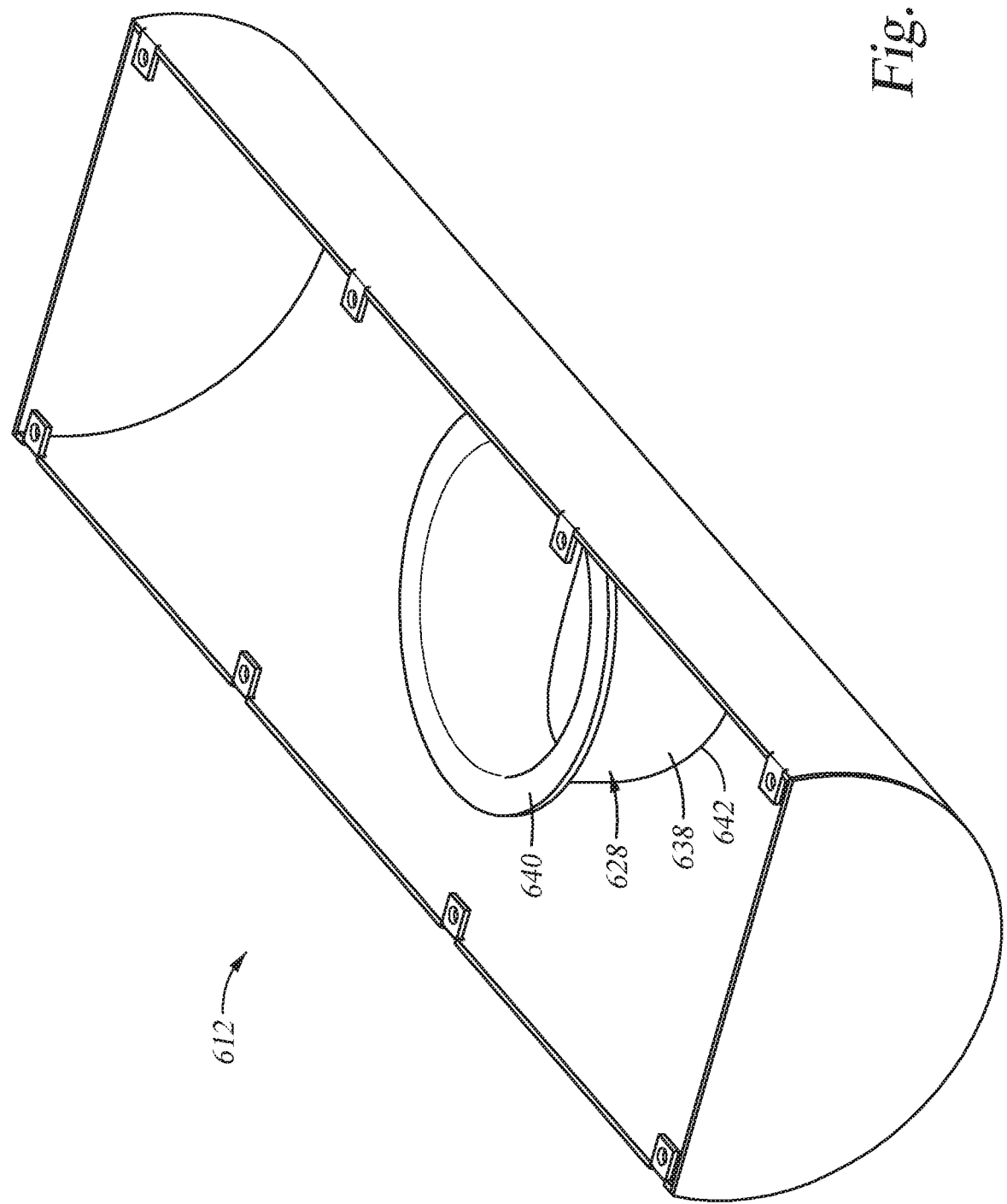
FIG. 7B is a perspective view of a liner according to one embodiment described herein.

The second liner 612 may include a device 628 having a wall 638, a first end 640, and a second end 642, as shown in FIG. 7B. The wall 638 may be cylindrical, as shown in FIG. 7B. Referring back to FIG. 6, the first end 640 may be spaced apart from the cooling plate 514 by a distance 641, and the second end 642 may be adjacent or coupled to the outlet 606.

During operation, exhaust exiting the plasma source 100 (FIG. 1) enters the exhaust cooling apparatus 117 via the inlet 604. The exhaust enters a region 646 surrounded by the device 618. The flow of the exhaust becomes turbulent as the exhaust comes into contact with the second portion 622 of the plate 619, causing particles to drop out of the exhaust. The exhaust exits the region 646 via the space between the inlet 604 and the first end 634 of the device 618. Particles dropped out of the exhaust may fall onto the second portion 622 of the plate 619. The exhaust then flows through the through holes 626 in the plate 619 and the through holes 616 in the cooling plate 614, and particles may condense and fall onto the second liner 612 as the temperature of the exhaust is reduced by the cooling plate 614. The exhaust then enters a region 650 defined by the device 628 through the space between the cooling plate 614 and the first end 640 of the device 628. The second end 609, along with the first liner 610 and the second liner 612, may be pulled out of the exhaust cooling apparatus 117 in order to remove the particles collected on first and second liners 610, 612. The pressure inside the exhaust cooling apparatus 117 during operation is monitored by a pressure sensor 613. The pressure sensor 613 may be coupled to the second end 609, as shown in FIG. 6. An injection port (not shown) may be formed in the second end 509 for injecting a reagent or diluent into the exhaust cooling apparatus 117.

Figure 8:
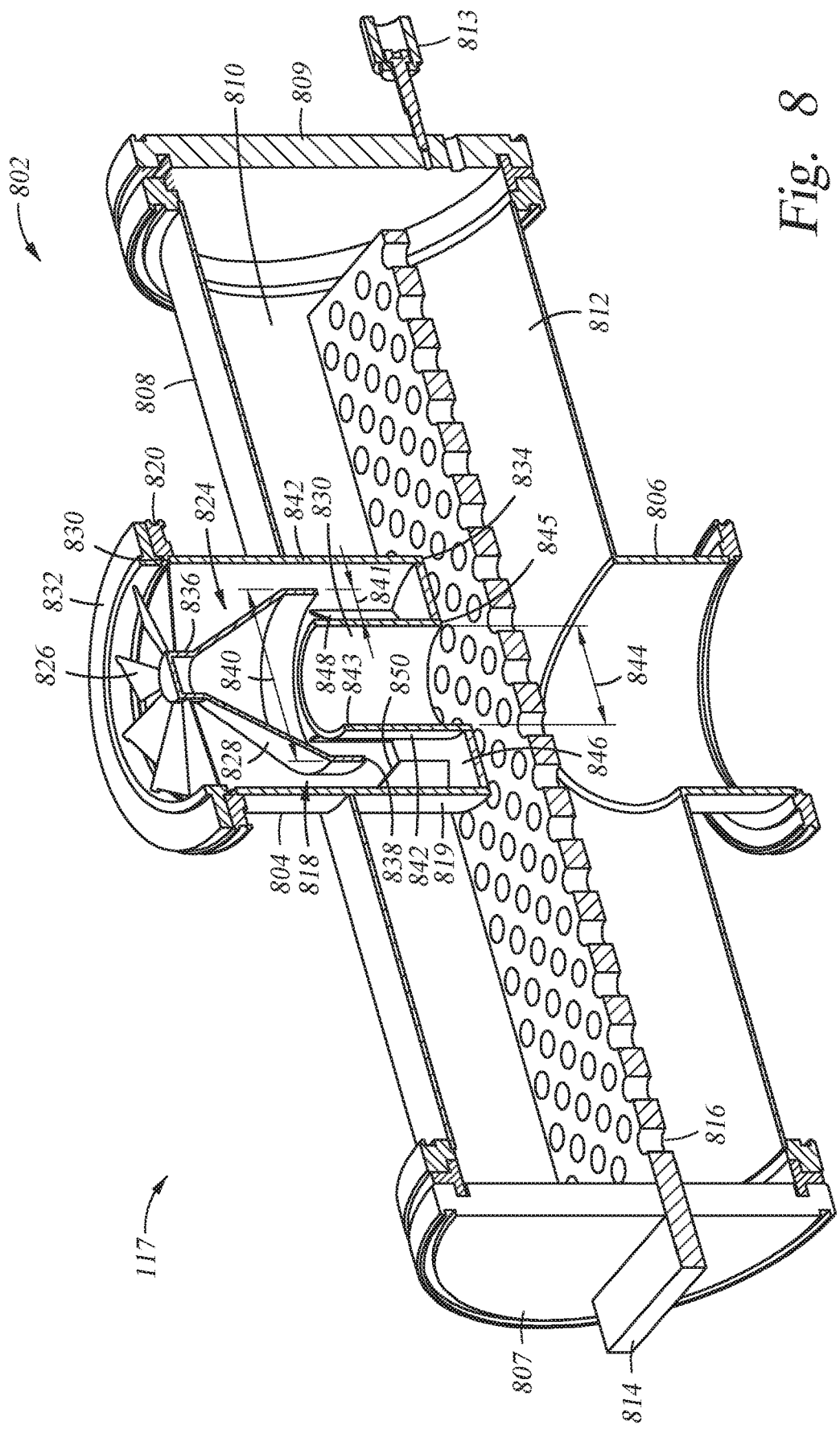
FIG. 8 is a cross-sectional view of the exhaust cooling apparatus according to one embodiment described herein.

FIG. 8 is a cross-sectional view of the exhaust cooling apparatus 117 according to one embodiment described herein. As shown in FIG. 8, the exhaust cooling apparatus 117 includes a body 802 having an inlet 804, an outlet 806, a first end 807, a second end 809 opposite the first end 807, and a wall 808 between the inlet 804 and the outlet 806 and between the first end 807 and the second end 809. The second end 809 may be removably coupled to the wall 808. The wall 808 may be cylindrical, as shown in FIG. 8. The exhaust cooling apparatus 117 may include a first liner 810 adjacent to the inlet 804, a second liner 812 adjacent to the outlet 806, and a cooling plate 814 disposed between the first liner 810 and the second liner 812. The first liner 810, the second liner 812, and the cooling plate 814 may be made of stainless steel, aluminum, nickel coated aluminum, or any suitable material. The cooling plate 814 may be coupled to the first end 807. The first liner 810 may be coupled to the second end 809 and the second liner 812 may be coupled to the second end 809. The cooling plate 814 may include a plurality of through holes 816. The cooling plate 814 may be the same as the cooling plate 314 shown in FIG. 3.

In order to trap particles in the exhaust cooling apparatus 117, a device is utilized to introduce turbulence to the exhaust flowing within the exhaust cooling apparatus 117 adjacent a cooled structure with high conductance to prevent a pressure increase in exhaust cooling apparatus 117. The cooled structure with high conductance may be the cooling plate 814, and the device may be a device 818. The device 818 may be made of stainless steel, aluminum, nickel coated aluminum, or any suitable material. The device 818 may include a body 819 including a first end 830 and a second end 834. The body 819 may be cylindrical, as shown in FIG. 8. The first end 830 may be coupled to a flange 832, and the flange 832 may be rested on a flange 820 of the inlet 804. The flange 832 may be utilized to couple to the plasma source 100 (FIG. 1). The second end 834 may extend into the wall 808 of the exhaust cooling apparatus 117 to a location above the cooling plate 814.

The device 818 may also include a diffuser 824 disposed within the body 819. The diffuser 824 may include a plurality of blades 826 coupled to a cone 828. The plurality of blades 826 may be located at the first end 830 of the body 819, and each blade 826 may be tilted with respect to the vertical in order to introduce turbulence to the exhaust entering the exhaust cooling apparatus 117. In one embodiment, each blade 826 is titled at about 45 degrees with respect to the vertical. The number of blades 826 may vary. In one embodiment, there are 10 blades 826. Disposed below the blades 826 is the cone 828. The cone 828 includes a first end 836 coupled to the blades 826 and a second end 838 opposite the first end 836. The second end 838 has a diameter 840 that is greater than a diameter of the first end 836. A hollow cylinder 842 may be disposed below the cone 828. The hollow cylinder 842 has a first end 843 and a second end 845 opposite the first end 843. The hollow cylinder 842 has a diameter 844 that is less than the diameter 840 of the second end 838 of the cone 828. The first end 843 of the hollow cylinder 842 may be level with the second end 838 of the cone 828, and a gap 841 may be formed between the first end 843 of the hollow cylinder 842 and the second end 838 of the cone 828 due to the different in diameters.

The second end 834 of the body 819 may be coupled to a bottom 846, and the bottom 846 may be coupled to the second end 845 of the hollow cylinder 842. In one embodiment, the bottom 846 is annular. A plurality of fins 848 may be coupled to the body 819. The fins 848 may be disposed over the bottom 846 or coupled to the bottom 846. Each fin 848 may include a top portion 850, and the top portion 850 may form an angle $A_6$ with respect to the body 819. The angle $A_6$ may be an acute angle. The number of fins 848 coupled to the body 819 may vary. In one embodiment, there are six fins 848 coupled to the body 819.

During operation, exhaust exiting the plasma source 100 (FIG. 1) enters the exhaust cooling apparatus 117 via the inlet 804. The exhaust becomes turbulent as the exhaust is entering the exhaust cooling apparatus 117 at an angle with respect to the vertical by the plurality of blades 826, causing particles to drop out of the exhaust. Particles dropping out of the exhaust may fall onto the bottom 846. The plurality of fins 848 can slow down particles falling onto the bottom 846. The exhaust enters the hollow cylinder 842 via the gap 841 and then flows through the through holes 816 in the cooling plate 814. Particles may condense and fall onto the second liner 812 as the temperature of the exhaust is reduced by the cooling plate 814. The exhaust then exits the exhaust cooling apparatus 117 via the outlet 806. The device 818 may be removable from the exhaust cooling apparatus 117 in order to remove the particles collected on the bottom 846 of the device 818. The second end 809, along with the first liner 810 and the second liner 812, may be pulled out of the exhaust cooling apparatus 117 in order to remove the particles collected on first and second liners 810, 812. The pressure inside the exhaust cooling apparatus 117 during operation is monitored by a pressure sensor 813. The pressure sensor 813 may be coupled to the second end 809, as shown in FIG. 8. An injection port (not shown) may be formed in the second end 809 for injecting a reagent or diluent into the exhaust cooling apparatus 117.

Figure 9:
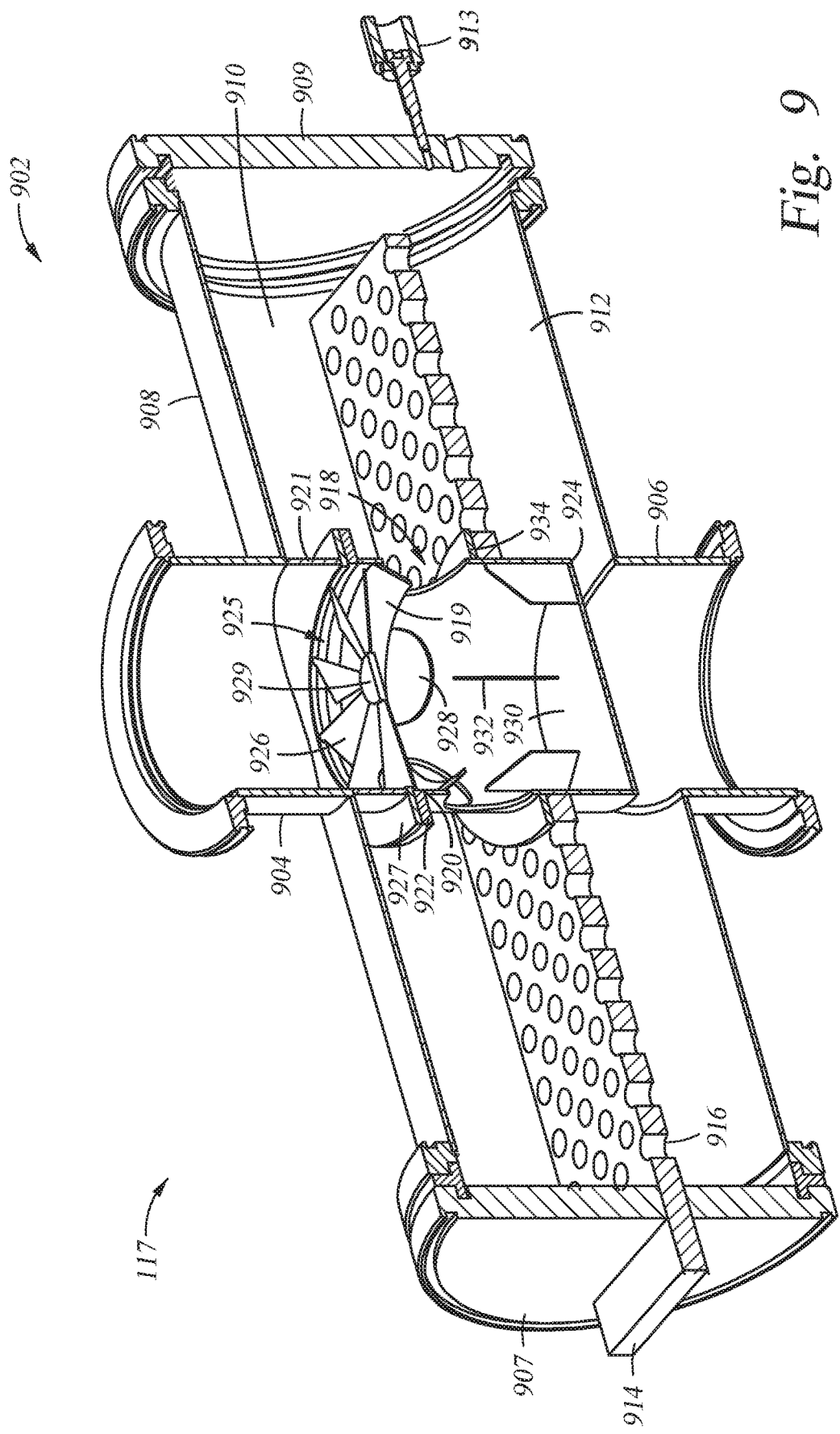
FIG. 9 is a cross-sectional view of the exhaust cooling apparatus according to one embodiment described herein.

FIG. 9 is a cross-sectional view of the exhaust cooling apparatus 117 according to one embodiment described herein. As shown in FIG. 9, the exhaust cooling apparatus 117 includes a body 902 having an inlet 904, an outlet 906, a first end 907, a second end 909 opposite the first end 907, and a wall 908 between the inlet 904 and the outlet 906 and between the first end 907 and the second end 909. The second end 909 may be removably coupled to the wall 808. The wall 908 may be cylindrical, as shown in FIG. 9. The exhaust cooling apparatus 117 may include a first liner 910 adjacent to the inlet 904, a second liner 912 adjacent to the outlet 906, and a cooling plate 914 disposed between the first liner 910 and the second liner 912. The first liner 910, the second liner 912, and the cooling plate 914 may be made of stainless steel, aluminum, nickel coated aluminum, or any suitable material. The cooling plate 914 may be coupled to the first end 907. The first liner 910 may be coupled to the second end 909 and the second liner 912 may be coupled to the second end 909. The cooling plate 914 may include a plurality of through holes 916. The cooling plate 914 may be the same as the cooling plate 314 shown in FIG. 3.

In order to trap particles in the exhaust cooling apparatus 117, a device is utilized to introduce turbulence to the exhaust flowing within the exhaust cooling apparatus 117 adjacent a cooled structure with high conductance to prevent a pressure increase in exhaust cooling apparatus 117. The cooled structure with high conductance may be the cooling plate 814, and the device may be a device 918. The device 918 may be made of stainless steel, aluminum, nickel coated aluminum, or any suitable material. The device 918 may include a body 919 including a first end 920 and a second end 924. The body 919 may be cylindrical, as shown in FIG. 9. The first end 920 may be disposed below the inlet 904, and the first end 920 may be coupled to a flange 922. The second end 924 may extend into the wall 908 of the exhaust cooling apparatus 117 to a location below the cooling plate 914.

The device 918 may include a diffuser 925 disposed at the first end 920 of the body 919. The diffuser 925 may include a flange 927 coupled to the flange 922. A ring 921 may be disposed on the flange 927 and may extend to the inlet 904. The diffuser 925 may include a plurality of blades 926 coupled to a center 929. The plurality of blades 926 may be the same as the plurality of blades 826 shown in FIG. 8. A plurality of openings 928 may be formed in the body 919.

The openings 928 may be circular, as shown in FIG. 9, or any other suitable shape. A bottom may be coupled to the second end 924 of the body 919. In one embodiment, the bottom 930 is circular. A plurality of fins 932 may be coupled to the body 919. The fins 932 may be disposed over the bottom 930 or coupled to the bottom 930, as shown in FIG. 9. The plurality of fins 932 may be the same as the plurality of fins 848 shown in FIG. 8. A flange 934 may be coupled to the body 919, and the flange 934 may rest on the cooling plate 914.

During operation, exhaust exiting the plasma source 100 (FIG. 1) enters the exhaust cooling apparatus 117 via the inlet 904. The exhaust becomes turbulent as the exhaust is entering the exhaust cooling apparatus 117 at an angle with respect to the vertical by the plurality of blades 926, causing particles to drop out of the exhaust. Particles dropping out of the exhaust may fall onto the bottom 930. The plurality of fins 932 can slow down particles falling onto the bottom 930. The exhaust exits the device 918 via the plurality of openings 928 and then flows through the through holes 916 in the cooling plate 914. Particles may condense and fall onto the second liner 912 as the temperature of the exhaust is reduced by the cooling plate 914. The exhaust then exits the exhaust cooling apparatus 117 via the outlet 906. The device 918 may be removable from the exhaust cooling apparatus 117 in order to remove the particles collected on the bottom 930 of the device 918. The second end 909, along with the first liner 910 and the second liner 912, may be pulled out of the exhaust cooling apparatus 117 in order to remove the particles collected on first and second liners 910, 912. The pressure inside the exhaust cooling apparatus 117 during operation is monitored by a pressure sensor 913. The pressure sensor 913 may be coupled to the second end 909, as shown in FIG. 9. An injection port (not shown) may be formed in the second end 909 for injecting a reagent or diluent into the exhaust cooling apparatus 117.

While the foregoing is directed to embodiments of the present disclosure, other and further embodiments of the disclosure may be devised without departing from the basic scope thereof, and the scope thereof is determined by the claims that follow.

The invention claimed is:
1. An exhaust cooling apparatus, comprising:
a body having a wall, a first end, a second end, an inlet, and an outlet, wherein the first end and the second end are on opposite sides of the body from each other, and wherein the inlet and the outlet are at least partially disposed between the first and second ends;
a cooling plate disposed within the body, wherein the cooling plate is connected to the first end, and wherein a gap separates the cooling plate and the second end; and
a device disposed over the cooling plate, wherein the device is between the inlet and the cooling plate and comprises:
a plate coupled to the wall; and
a plurality of fins extending from the plate and extending away from the cooling plate, wherein the plurality of fins comprises:
a center fin forming a first angle with respect to the plate;
a first angled fin forming a second angle with respect to the plate, the second angle is an acute angle facing the center fin; and
a second angled fin forming a third angle with respect to the plate, the third angle is an acute angle facing the center fin, and the second angle is greater than the third angle.

2. The exhaust cooling apparatus of claim 1, wherein the first angle is about 90° with respect to the plate.

3. The exhaust cooling apparatus of claim 1, wherein the plate is parallel to the cooling plate.

4. The exhaust cooling apparatus of claim 1, wherein the cooling plate comprises a plurality of through holes.

5. An exhaust cooling apparatus, comprising:
   a body having a wall, a first end, a second end, an inlet, and an outlet, wherein the first end and the second end are on opposite sides of the body from each other, and wherein the inlet and the outlet are at least partially disposed between the first and second ends;
   a cooling plate disposed within the body, wherein the cooling plate is connected to the first end, and wherein a gap separates the cooling plate and the second end; and
   a first liner disposed over the cooling plate, wherein the first liner is between the inlet and the cooling plate and comprises:
      a plate coupled to an end of the wall; and
      a plurality of fins extending from the plate and extending away from the cooling plate, wherein the plurality of fins comprises:
         a center fin forming a first angle with respect to the plate;
         a first angled fin forming a second angle with respect to the plate, the second angle is an acute angle facing the center fin; and
         a second angled fin forming a third angle with respect to the plate, the third angle is an acute angle facing the center fin, and the second angle is greater than the third angle.

6. The exhaust cooling apparatus of claim 5, wherein the first angle is about 90° with respect to the plate.

7. The exhaust cooling apparatus of claim 5, wherein the plate is parallel to the cooling plate.

8. The exhaust cooling apparatus of claim 5, wherein the cooling plate comprises a plurality of through holes.

9. The exhaust cooling apparatus of claim 1, wherein the plurality of fins comprises a first pair of angled fins and a second pair of angled fins, wherein the first pair of angled fins is separated from the second pair of angled fins by the center fin, and wherein the first pair of fins comprises the first angled fin and the second angled fin.

10. The exhaust cooling apparatus of claim 9, wherein the first pair of angled fins and the second pair of angled fins are mirror images of each other.

11. The exhaust cooling apparatus of claim 10, wherein the center fin forms a right angle with respect to the plate.

12. The exhaust cooling apparatus of claim 5, wherein the plurality of fins comprises a first pair of angled fins and a second pair of angled fins, wherein the first pair of angled fins is separated from the second pair of angled fins by the center fin, and wherein the first pair of fins comprises the first angled fin and the second angled fin.

13. The exhaust cooling apparatus of claim 12, wherein the first pair of angled fins and the second pair of angled fins are mirror images of each other.

14. The exhaust cooling apparatus of claim 5, further comprising a second liner disposed below the cooling plate.

15. The exhaust cooling apparatus of claim 1, wherein the second angled fin is between the center fin and the first angled fin.

16. The exhaust cooling apparatus of claim 5, wherein the second angled fin is between the center fin and the first angled fin.

17. The exhaust cooling apparatus of claim 1, wherein the plate comprises a an opening disposed between the first angled fin and the first or second end of the body.

18. The exhaust cooling apparatus of claim 1, wherein the plate comprises:
   a first opening disposed between the first end of the body and the plurality of fins, and
   a second opening disposed between the second end of the body and the plurality of fins.

19. The exhaust cooling apparatus of claim 5, wherein the plate comprises a an opening disposed between the first angled fin and the first or second end of the body.

20. The exhaust cooling apparatus of claim 5, wherein the plate comprises:
   a first opening disposed between the first end of the body and the plurality of fins, and
   a second opening disposed between the second end of the body and the plurality of fins.

* * * * *